(12) United States Patent
Kumai et al.

(10) Patent No.: US 8,831,317 B2
(45) Date of Patent: Sep. 9, 2014

(54) MAGNETIC RESONANCE IMAGING APPARATUS AND BLOOD VESSEL IMAGING METHOD

(75) Inventors: Hideki Kumai, Tokyo (JP); Taeko Ito, Tokyo (JP)

(73) Assignee: Hitachi Medical Corporation, Tokyo (JP)

(*) Notice: Subject to any disclaimer, the term of this patent is extended or adjusted under 35 U.S.C. 154(b) by 740 days.

(21) Appl. No.: 12/742,390

(22) PCT Filed: Nov. 6, 2008

(86) PCT No.: PCT/JP2008/070195
§ 371 (c)(1),
(2), (4) Date: May 11, 2010

(87) PCT Pub. No.: WO2009/063791
PCT Pub. Date: May 22, 2009

(65) Prior Publication Data
US 2010/0226556 A1  Sep. 9, 2010

(30) Foreign Application Priority Data

Nov. 16, 2007  (JP) ................................. 2007-297534

(51) Int. Cl.
  *G06K 9/00*  (2006.01)
  *G01R 33/563*  (2006.01)
  *G01R 33/561*  (2006.01)
  *G01R 33/56*  (2006.01)
  *G01R 33/483*  (2006.01)

(52) U.S. Cl.
  CPC ........ *G01R 33/5635* (2013.01); *G01R 33/5607* (2013.01); *G01R 33/5602* (2013.01); *G01R 33/4835* (2013.01); *G01R 33/5614* (2013.01)
  USPC ......................................................... 382/131

(58) Field of Classification Search
  USPC .................................... 382/128–134; 600/300
  See application file for complete search history.

(56) References Cited

U.S. PATENT DOCUMENTS

| 5,000,182 A * | 3/1991 | Hinks ........................... 600/413 |
| 5,422,577 A * | 6/1995 | Kasugai ........................ 324/309 |
| 6,320,377 B1 * | 11/2001 | Miyazaki et al. ............. 324/306 |
| 6,442,414 B1 * | 8/2002 | Watanabe ..................... 600/419 |

FOREIGN PATENT DOCUMENTS

| JP | 5-95932 | 1/1992 |
| JP | 4-8350 | 4/1993 |

(Continued)

OTHER PUBLICATIONS

Takane et al., English Translation of Japanese Patent 5-95932, Jan. 1992.*
Akatsu et al., English Translation of Japanese Patent JP4-8350, Apr. 1993.*

(Continued)

*Primary Examiner* — Sind Phongsvirajati
*Assistant Examiner* — Jonathan K Ng
(74) *Attorney, Agent, or Firm* — Cooper & Dunham LLP (57) ABSTRACT

Blood streams different in direction can be selectively depicted, and a blood vessel image (MRA image) which has an excellent blood vessel contrast and in which a background signal is suppressed is obtained. Therefore, the present invention sets a pre-saturation area (pre-saturation area) in an area containing at least a part of an imaging area and performs imaging in a blood vessel imaging operation using a pre-saturation pulse for pre-exciting spins.

15 Claims, 9 Drawing Sheets

(56) References Cited

FOREIGN PATENT DOCUMENTS

| | | |
|---|---|---|
| JP | 7-23921 | 1/1995 |
| JP | 10-323336 | 12/1998 |
| JP | 2001-8918 | 1/2001 |
| JP | 2001-252263 | 9/2001 |

OTHER PUBLICATIONS

Mugler et al., "The Design of Pulse Sequences Employing Spatial Presaturation for the Suppression of Flow Artifacts", Magn Reson Med. Feb. 1992;23(2):201-14.*
Japanese official action dated Mar. 18, 2013 in a corresponding Japanese patent application.

* cited by examiner

MAGNETIC RESONANCE IMAGING APPARATUS AND BLOOD VESSEL IMAGING METHOD

TECHNICAL FIELD

The present invention relates to imaging of blood vessel/blood stream (MRA) in a magnetic resonance imaging apparatus having blood stream depicting performance (hereinafter referred to as MRI apparatus).

BACKGROUND ART

MRI is an apparatus for applying RF magnetic field to an examinee disposed under magnetostatic field to detect an echo signal occurring in the examinee and subjecting the detected echo signal to signal processing, thereby imaging the echo signal. A Time-of-flight method (hereinafter referred to as TOF method) is general as a blood-vessel imaging method in the MRI apparatus. Particularly, with respect to sites such as four limbs, there have been recently used a method of imaging blood vessels by using a sequence of repetitively irradiating these sites with RF pulses at a short time interval to image these sites under the state that magnetization is set to a stationary state (SSFP).

This SSFP pulse sequence does not take on blood vessel depicting performance which is dependent on blood stream velocity as in the case of the TOF method, but depicts, as high signals, blood, spinal fluid, synovial fluid, bladder, fat, etc. which have long T2 values because obtained signals are represented by T2/T1($\sqrt{T2/T1}$)). Therefore, this method is one of imaging methods which take over from the TOF method with respect to four limbs, etc. which are relatively low in blood stream velocity.

A pre-saturation method is used as a method of selectively depicting each of artery and vein (patent document 1, patent document 2, etc.). According to this method, an imaging area is set vertically to blood vessel running of an examinee to perform blood stream imaging. At this time, spins of an area adjacent to the imaging area are pre-excited before the imaging area is excited, thereby suppressing a signal from a blood stream flowing into the imaging area. Accordingly, the blood stream flowing in the opposite direction to the blood stream flowing from the pre-excited area to the imaging area is selectively depicted. The pre-exciting pulse is called as pre-saturation pulse, and the pre-excited area is hereunder referred to as pre-saturation area.

Patent Document 1: JP-A-10-248825
Patent Document 1: JP-A-7-327956

DISCLOSURE OF THE INVENTION

Problem to be Solved by the Invention

In a case where arteriorvenous separation is executed by using the pre-saturation method, particularly when signals from vein having a low blood stream velocity are suppressed, venous blood to which a pre-saturation pulse is applied insufficiently flows into the imaging area, so that blood having magnetization in which longitudinal relaxation proceeds is stagnant in the imaging area. Therefore, insufficient suppression of the signals from vein in the imaging area has caused a critical problem.

Furthermore, according to the blood vessel imaging method using the SSFP pulse sequence, a tissue having a long T2 value is depicted as a high signal as described above. Therefore, this method has a problem that spinal fluid, synovial fluid, bladder, fat, etc. are also depicted as high signals in addition to the blood vessel signal.

Therefore, an object of the present invention is to enable selective depiction of blood streams different in flow directions and obtain a blood vessel image (MRA image) having a high blood vessel contrast in which a background signal is suppressed.

Means of Solving the Problem

In order to attain the above object, according to the present invention, blood vessel imaging using a pre-saturation pulse for pre-exciting spins is performed while a pre-saturation area (pre-saturation area) is set in an area containing at least a part of an imaging area, whereby the signal from blood stagnant in the imaging area which has caused control defect in the conventional methods can be suppressed, and the background signal in the imaging area (spinal fluid, synovial fluid, bladder, fat, etc.) can be suppressed at the same time. Accordingly, an MRA image having an excellent blood vessel contrast can be stably obtained.

Specifically, an MRI apparatus of this invention is characterized by comprising: a measurement controller for controlling measurement of an echo signal from an imaging area containing a blood stream of an examinee on the basis of a pulse sequence containing a pre-saturation pulse for pre-saturating a desired area of an examinee and an actual imaging sequence for measuring an echo signal from the examinee; and a calculation processor for re-constructing a blood vessel image by using the echo signal, wherein the measurement controller controls the area to be pre-saturated by the pre-saturation pulse in the imaging area in accordance with the velocity of the blood stream.

Furthermore, a blood vessel imaging method according to the present invention is characterized by comprising: a step of setting an area to be pre-saturated by a pre-saturation pulse in an imaging area in accordance with the velocity of a blood stream, a pre-saturating step of pre-saturating the set pre-saturating area by the pre-saturation pulse, a measurement step of measuring an echo signal from the imaging area, and a re-constructing step of re-constructing a blood vessel image by using the echo signal.

Effect of the Invention

According to the present invention, imaging is performed while the pre-saturation area is set in the area containing at least a part of the imaging area, whereby the blood streams different in flow direction can be selectively depicted. In addition, the background signal is suppressed, whereby an MRA image having an excellent blood vessel contrast can be obtained.

DESCRIPTION OF REFERENCE NUMERALS

1 magnetostatic field generating magnetic circuit, 2 gradient magnetic field generating system, 3 transmission system, 4 reception system, 5 signal processing system, 6 sequence, 7 CPU, 8 operating unit, 9 examinee

BEST MODES FOR CARRYING THE INVENTION

Embodiments of the present invention will be described with reference to the drawings.

Figure 1:
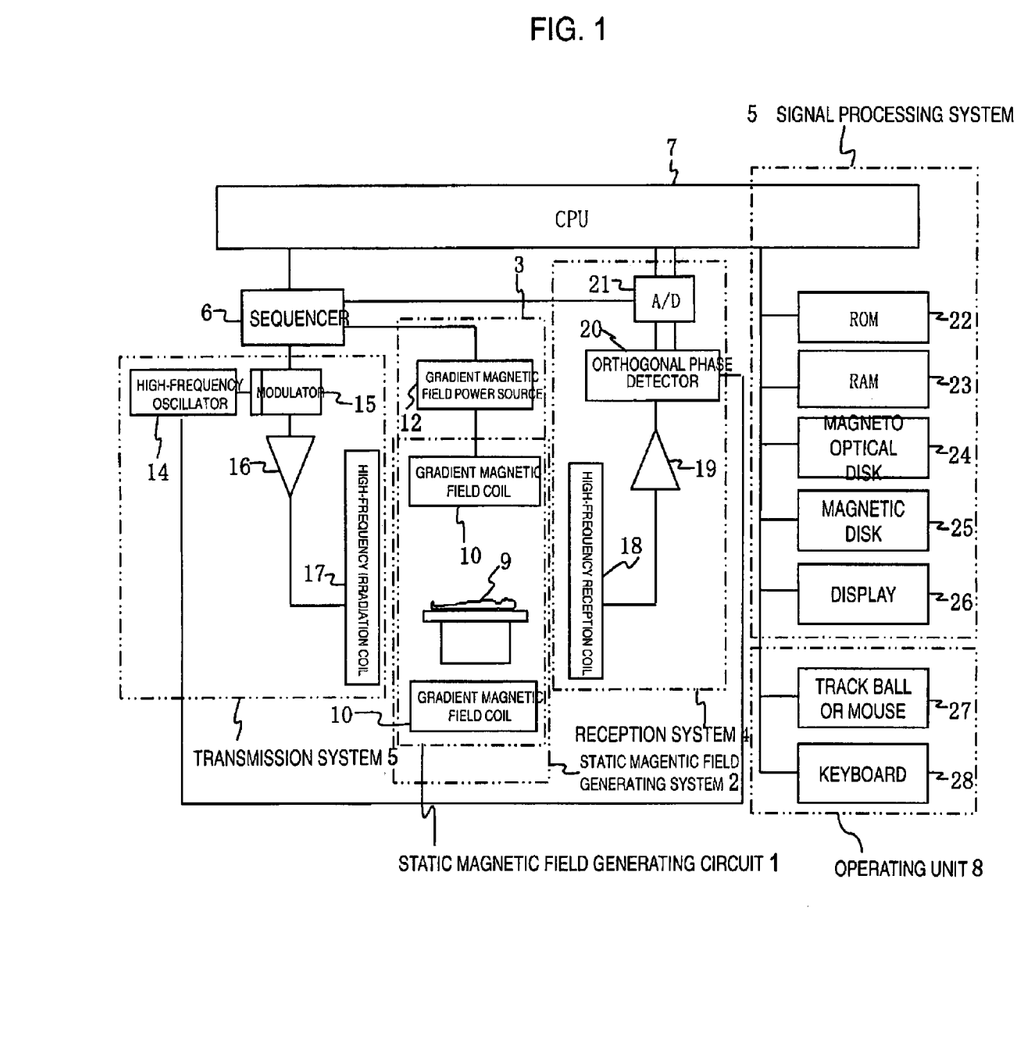
FIG. 1 is a block diagram showing the overall construction of an MRI apparatus to which the present invention is applied.

FIG. 1 is a block diagram showing the overall construction of an MRI apparatus to which the present invention is applied. The MRI apparatus has a magnetostatic field generating magnetic circuit 1, a gradient magnetic field generating system 2, a transmission system 3, a reception system 4, a signal processing system 5, a sequencer 6, a central processing unit (CPU) 7, and an operating unit 8.

The magnetostatic field generating magnetic circuit 1 generates uniform magnetostatic field in a body axis direction or a direction perpendicular to the body axis direction around the examinee 9, and a permanent magnet type, a normal conduction type or superconduction type magnetic field generating means is disposed in a space having some spread around the examinee 9. The gradient magnetic field generating system 2 comprises gradient magnetic field coils 10 which are wound in three axis directions of X, Y and Z, and a gradient magnetic field power source 12 for driving each of the coils. A gradient magnetic field power source 11 of each of the gradient magnetic field coils 10 is driven according to an instruction from a sequencer 6, whereby the gradient magnetic fields Gs, Gp, Gf in the three axis directions of X, Y, Z are applied to the examinee 9. In accordance with the manner of applying the gradient magnetic field, position information can be added to a nuclear magnetic resonance signal (echo signal), and a slice plane can be set to the examinee 9.

The transmission system 3 emits a radio-frequency signal to induce nuclear magnetic resonance in atomic nucleuses of atoms constituting a biological tissue of the examinee 9 by a high-frequency magnetic field pulse transmitted from the sequencer 6, and it comprises a high-frequency oscillator 14, a modulator 15, a high-frequency amplifier 16 and a high-frequency coil 17 at the transmission side. The RF pulse output from the high-frequency oscillator 14 is amplified by the high-frequency amplifier 16, and then supplied to a high-frequency coil 18 at the reception side which is disposed in proximity to the examinee 9, whereby the examinee 9 is irradiated with electromagnetic waves.

The reception system 4 detects an echo signal discharged due to nuclear magnetic resonance of atomic nucleuses of the biological tissue of the examinee 9, and it comprises the high-frequency coil 18 at the reception side, an amplifier 19, an orthogonal phase detector 20 and an A/D converter 21. An electromagnetic wave (NMR signal) as a response of the examinee 9 to an electromagnetic wave irradiated from the high-frequency coil 17 at the transmission side is detected by the high-frequency coil 18 at the reception side disposed in proximity to the examinee 9, input to the A/D converter 21 through the amplifier 19 and the orthogonal phase detector 20 to be converted to a digital amount, sampled by the orthogonal phase detector 20 at an instructed timing from the sequencer 6 to obtain collection data of two systems, and then transmitted to a signal processing system 5.

The signal processing system 5 performs image re-constructing calculation by using the echo signal detected in the reception system 4, and also displays an image, and it comprises CPU 7 for executing the processing such as Fourier Transform, correcting coefficient calculation, image re-construction, etc. on the echo signal and performing control of the sequencer 6, ROM (read only memory) 22 for storing programs for performing time-lapse image analysis processing and time count, invariable parameters used for the execution of the processing described above, etc., RAM (random access memory) 23 for temporarily storing the measurement parameters obtained in the above measurement, the echo signal detected by the reception system 4 and an image used to set a region of interest, parameters for setting the region of interest, etc., a magnetooptical disk 24 and a magnetic disk 25 as a data storage unit in which image data reconstructed in CPU 7 are recorded, and a display 26 as a display unit for visualizing image data read out from the magnetooptical disk 24 or the magnetic disk 25 and displaying it as a tomogram.

The sequencer 6 constitutes control means together with CPU 7, and it is operated under the control of CPU 7 to transmits various kinds of commands required for collecting data of tomograms of the examinee 9 to the transmission system 3 or the gradient magnetic field generating system 2 and the reception system 4. The MRI apparatus of this invention is provided with a pulse sequence for depicting a blood stream (actual measurement sequence) and a pre-saturation pulse combined with the pulse sequence concerned as a pulse sequence corresponding to a control program of the sequencer 6. The control means has a function of controlling an exciting area of the pre-saturation pulse and the interval from the actual measurement sequence.

The operating unit 8 inputs control information for the processing to be executed in the signal processing system 5, and has a mouse 27, a keyboard 28, etc. A user can use the operating unit 8 and the display 26 as a user interface to set a required imaging condition and give an instruction to the control means.

First Embodiment

Next, an embodiment of a blood stream imaging method using the MRI apparatus constructed as described above will be described. In this embodiment, an area to be pre-saturated by a pre-saturation pulse in an imaging area is controlled in accordance with the velocity of a blood stream.

Figure 2:
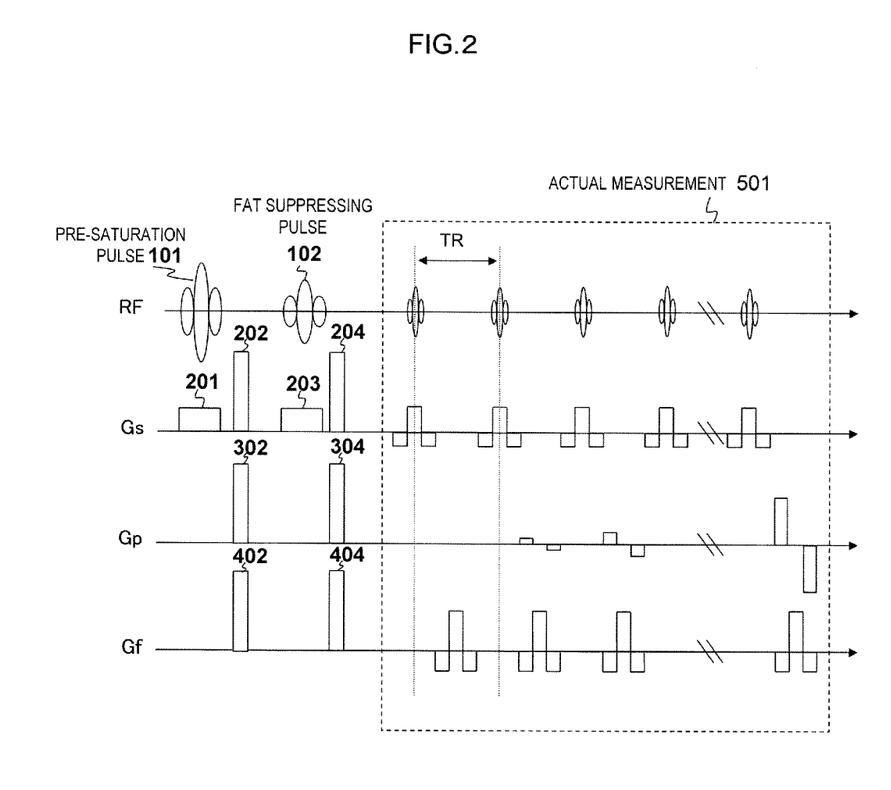
FIG. 2 is a diagram showing an example of an imaging sequence for depiction of blood vessels adopted in this invention.
Figure 3:
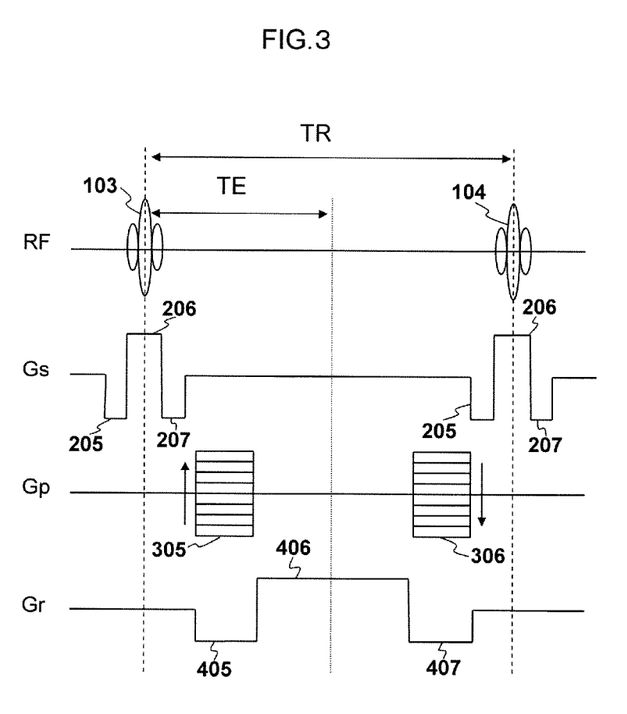
FIG. 3 is a diagram showing an SSFP sequence adopted in actual measurement of FIG. 2.
Figure 4:
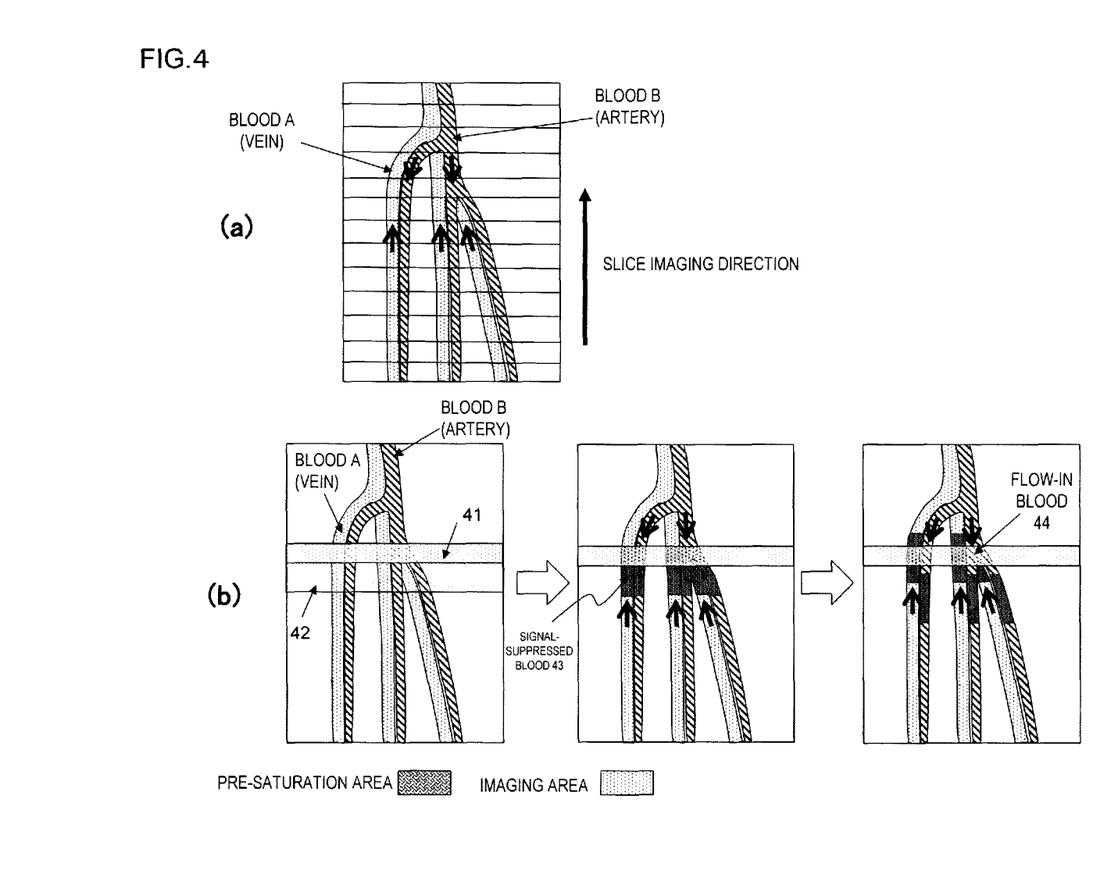
FIG. 4 is a diagram showing the relationship between an imaging area and a pre-saturation area.

FIGS. 2 and 3 show an example of an imaging sequence adopted in this embodiment. FIG. 2 is a diagram showing an SSFP pulse sequence accompanying a pre-saturation pulse and a fat suppression pulse. FIG. 3 is a diagram showing a part of the imaging sequence shown in FIG. 2. FIG. 4 is a diagram showing an area excited by the imaging sequence shown in FIG. 2. In FIGS. 2 and 3, the abscissa axis represents the time, and the ordinate axis represents the intensity of each signal. An RF pulse, slice gradient magnetic field Gs, phase encode gradient magnetic field Gp and frequency encode gradient magnetic field Gr corresponding to lead-out gradient magnetic field are successively shown from the upper side.

In this embodiment, as shown in FIG. 4(*a*), an imaging cross-section (slice) 41 is set to be substantially orthogonal to the running direction of a blood vessel to be imaged, and images of plural slices are successively picked up along the running direction of the blood vessel to obtain image data of a desired area. In general, blood flowing in the imaging area contains artery and vein, and when an image of one blood, for example, artery B is picked up, as shown in FIG. 4(b), an area (pre-saturation area) 42 at the downstream side of the artery B with respect to the imaging cross-section 41 is pre-saturated by a pre-saturation pulse to pick up an image of the imaging cross-section 41. At this time, the pre-saturation area is set so that a part of the pre-saturation area 42 is overlapped with a part of or the whole of the imaging cross-section 41. FIG. 4(b) shows a case where the whole of the imaging cross-section 41 is pre-saturated.

The imaging procedure will be described with reference to an imaging sequence of FIG. 2. First, an RF pulse 101 for pre-saturation is irradiated while a slice gradient magnetic field pulse 201 for selecting an area to be pre-saturated is applied. At this time, the area to be pre-saturated is located at a blood-stream flow-in side at which a signal should be suppressed, with respect to the imaging cross-section, and the width and the area is automatically or manually set in consideration of the blood stream velocity. By applying gradient magnetic field pulses 202, 302, 402 in a slice direction, a phase encode direction and a reading direction after the pre-saturation pulse 101 is applied, the phase of spins excited by the RF pulse 101 is diffused so that the spins do not generate any magnetic nuclear resonance signal when the subsequent actual measuring sequence 501 is executed. The gradient magnetic field pulses 202, 302, 402 are preferably applied in all the three axis directions. However, it is not necessarily required to apply them in all the three axis directions insofar as the phase of spins excited by the RF pulse 101 is diffused and the phase of the macro lateral magnetization of the spins is randomly diffused, so that the combined components can be reduced.

Subsequently, an RF pulse 102 for suppressing fat is irradiated while a slice gradient magnetic field pulse 203 for selecting a slice site to be subjected to fat suppression is applied. In this case, the slice portion is the same as the imaging cross-section in the actual measurement, however, the RF pulse 102 is a frequency selecting pulse and excites only the fat in the imaging cross-section. Thereafter, predetermined gradient magnetic field pulses 204, 304, 404 are applied to diffuse the phase of spins excited by the RF pulse 102 as in the case of the situation subsequent to the application of the pre-saturation pulse. The fat suppression is particularly effective to a case where the pulse sequence of the actual measurement is an SSFP sequence as in the case of this embodiment, however, this is not indispensable in this invention. It may not be executed particularly when the time from the pre-saturation pulse 101 till the pulse sequence 501 of the actual measurement is sufficiently short.

As shown in FIG. 3 in detail, the actual measurement sequence applies the high-frequency pulse 103 and the slice selecting gradient magnetic pulse 206 to select a slice. Subsequently, a re-phase gradient magnetic field 207 in the slice direction for collecting the magnetization diffused by the slice selection gradient magnetic field pulse 206, an offset gradient magnetic field 305 in the phase encode direction and an offset gradient magnetic field pulse 405 in the reading direction are applied, and then the reading gradient magnetic field pulse 406 is applied. At this time, an echo signal generated under the application of the reading gradient magnetic field pulse 406 is received.

Subsequently, a re-phase gradient magnetic field 407 in the reading direction and a rewinding gradient magnetic pulse 306 in the phase direction are applied. Furthermore, an offset gradient magnetic field pulse 205 for a slice direction gradient magnetic field pulse 206 of a next RF pulse 104 is applied. The pulse sequence is controlled so that the total of the gradient magnetic application amount within one repeat time (TR) is equal to zero as described above, the imaging can be performed while the magnetization is set to the stationary state (SSFP). Under this state, the pulse sequence is repeated at TR to measure echo signals whose number is required for the image of one slice. All the echo signals are not measured by one actual measurement, but echo signals whose number is required to obtain one slice image may be measured by several actual measurements.

For example, when 32 echoes are obtained by one actual measurement for the phase encode number of 128, the data of one image can be obtained by repeating the imaging sequence shown in FIG. 2 at four times.

The measurement as described above is executed while successively varying the slice, and the data of the overall imaging area shown in FIG. 4(a) are finally collected. With respect to the image picked up as described above, during the time period from the pre-saturation pulse 101 of the imaging sequence shown in FIG. 2 till the pulse sequence 501 of the actual measurement, blood 43 of vein A which is subjected to signal suppression flows into the imaging cross-section and also blood 44 of artery B which is not subjected to signal suppression flows into the imaging cross-section (FIG. 4(b)). Accordingly, only the artery B can be selectively imaged.

Figure 5:
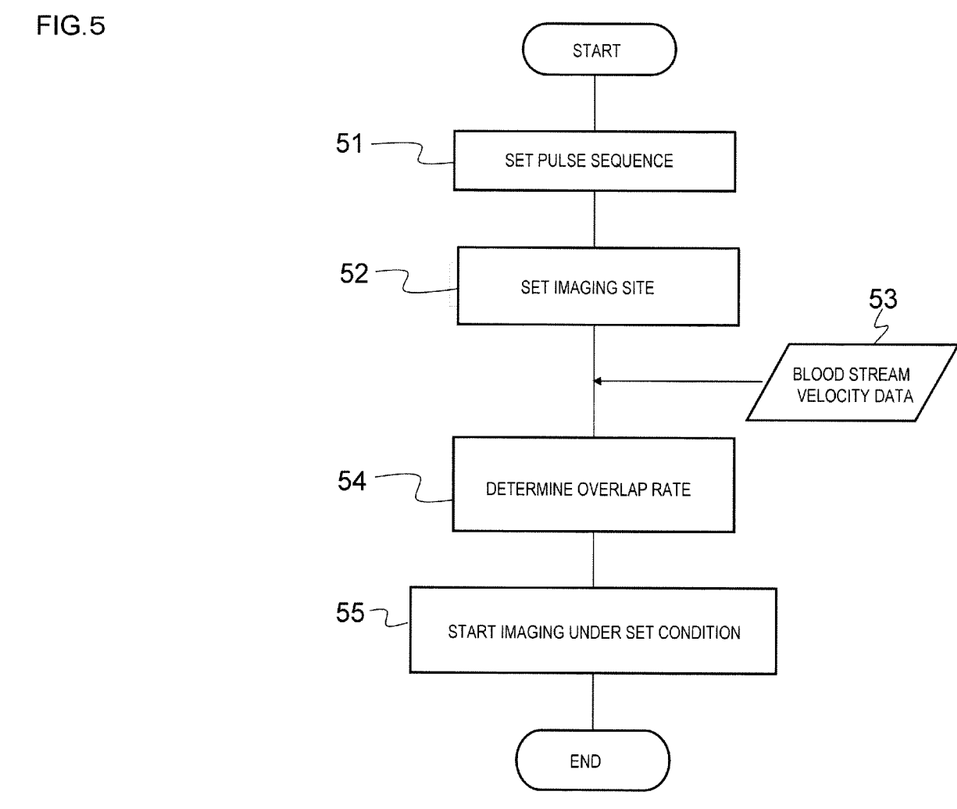
FIG. 5 is a diagram showing an embodiment of the procedure of pre-saturation control.

Next, the setting of the pre-saturation area will be described. FIG. 5 is a flowchart showing the procedure of setting the pre-saturation area.

First, when the user selects the imaging sequence and sets required parameters (echo time TE, slice thickness D, etc.), the time T[sec] from application of a pre-saturation pulse till start of an actual measurement (application of a first RF pulse 103) and the slice thickness D[cm] are determined (step 51). Furthermore, when an imaging site is set (step 52), information of a blood stream velocity is readout from a table 53 representing the relationship between pre-registered imaging sites and blood stream velocities, and a pre-saturation area is set (step 54). The information on the blood stream velocity is not read out from the table 53, but the user may be prompted to input an estimated blood stream velocity in accordance with the imaging site of the examinee. Alternatively, the blood stream velocity determined by the previous measurement may be automatically set.

As described above, this embodiment is characterized in that a pre-saturation area is added to an area adjacent to an imaging cross-section and set at the imaging cross-sectional side. In the setting step 54 of the pre-saturation area, the rate of the pre-saturation area overlapped with the imaging cross-section to the image cross-section is calculated as an overlap rate.

The calculation of the overlap rate is executed as follows. The blood stream velocity of blood A to be subjected to signal suppression is represented by Va[cm/sec], and the blood stream velocity of blood B to be imaged is represented by Vb[cm/sec]. The time t[sec] from application of pre-saturation till the time when the blood A of the blood stream velocity Va perfectly flows into the imaging slice having the thickness D is represented by the following expression (1).

$$t1 = d/Va \quad (1)$$

In the actual measurement, in order to fill the imaging cross-section with the pre-saturated blood A and suppress the signal from the blood A, the time t1 is required to be shorter than the interval T between the pre-saturation pulse and the actual measurement (the following expression 2), that is, required to satisfy Va≥d/T.

$$T \geq t1 \quad (2)$$

However, when the expression (2) is not satisfied, that is, when the blood stream velocity Va of the blood A is lower than d/T, the suppression of the signal is incomplete. In order to make t1 satisfy the expression (2), the overlap rate R may be made to satisfy the following expression (3).

$$T \geq (d \times (100-R)/100)/Va \quad (3)$$

On the other hand, when the overlap rate is represented by R, the following expression (4) is required to be satisfied so that a blood stream to which the pre-saturation pulse is applied in the blood B as an imaging target perfectly flows out from the imaging cross-section. Accordingly, the overlap rate R is determined so as to satisfy the expressions (3) and (4).

$$T \geq (d \times R/100)/Vb \quad (4)$$

In general, when the blood A is vein and the blood B is artery, the relation of Vb>Va is satisfied. Therefore, both the expressions (3) and (4) can be satisfied even when the overlap rate R exceeds 50%.

As described above, the pre-saturation area is overlapped with the imaging area, whereby the imaging cross-section is filled with the pre-saturated blood A and the non-pre-saturated blood B at the time point of the actual measurement as shown in FIG. 4(b), so that only the artery B can be depicted with excellent image quality.

The flow shown in FIG. 5 is executed prior to the imaging at the stage that the user sets the pulse sequence and the imaging site. Accordingly, when the overlap rate of the pre-saturation area is set, the measurement accompanying the pre-saturation pulse is subsequently repeated at the set overlap rate while the imaging cross-section (slice) is moved as shown in FIG. 4(a), thereby obtaining data of an area having a predetermined volume. The data of the respective imaging cross-sections are combined with one another to finally obtain a blood vessel image of the area having the predetermined volume. The moving direction of the imaging cross-section is not limited, however, it is preferably set to the opposite direction to the blood stream direction of blood to be imaged. Accordingly, blood to which no pre-saturation pulse is applied is made to flows into a next imaging cross-section at all times.

According to this embodiment, the imaging can be performed while the pre-saturation area is overlapped with the imaging cross-section in accordance with the blood stream velocity, and thus a blood stream image which is not deteriorated in image quality due to insufficient pre-saturation can be obtained for a site having a slow blood stream.

In the embodiment described above, the sequence of performing imaging while the magnetization is set to the stationary state (SSFP) is used as the actual measurement sequence, however, the TOE method or a normal gradient type pulse sequence may be used.

Second Embodiment

In this embodiment, a blood stream flowing into an area as shown in FIG. 4(a) is depicted by using the imaging sequence shown in FIG. 2 as in the case of the first embodiment. However, in the first embodiment, after the overlap rate of the pre-saturation area is set, plural slices are imaged while the overlap rate is fixed. On the other hand, this embodiment is characterized in that the overlap rate is different between at least two slices.

Figure 6:
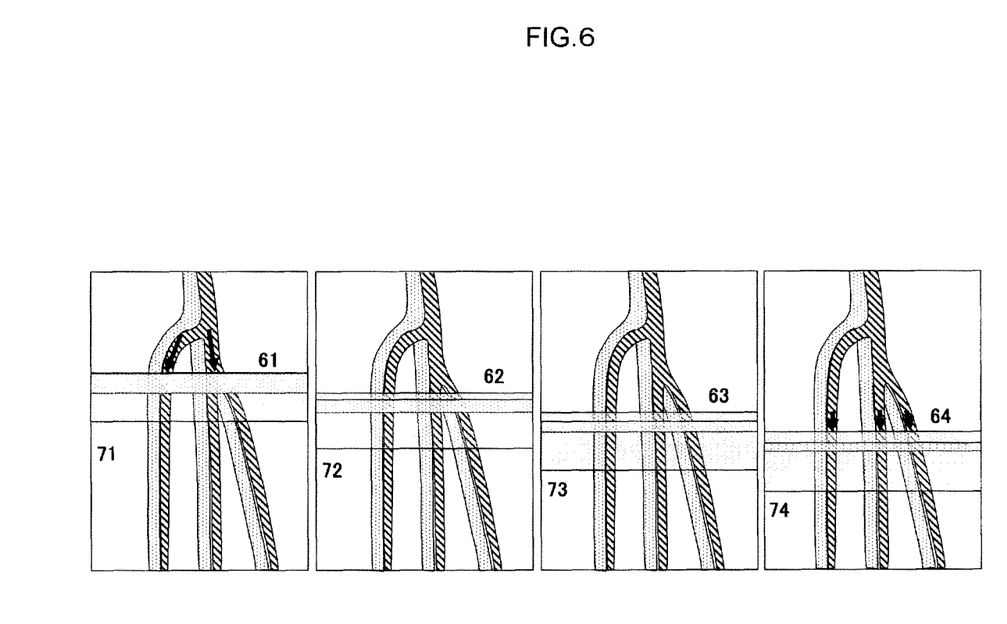
FIG. 6 is a diagram showing the embodiment of the pre-saturation control.

FIG. 6 is a diagram showing an aspect that different slices 61, 62, 63, 64 are successively imaged.

In order to depict blood flowing in a direction indicated by an arrow in FIG. 6, areas 71, 72, 73, 74 at the downstream side of a blood stream as a target are pre-saturated by a pre-saturation pulse with respect to each slice. At this time, the overlap rate of the pre-saturation area is varied as the slice to be imaged is shifted to the downstream side. In general, the blood stream velocity of artery is lowered as the location thereof shifts to the downstream side, and thus the time for which the pre-saturated blood stream (artery) wholly flows out is long. In this case, the overlap rate is reduced as the imaging target slice is shifted to the downstream side. That is, when the slice is shifted in such a direction that the blood stream velocity of a blood stream as a target is lowered, the overlap rate is gradually reduced in the same direction. Conversely, when the slice is shifted in such a direction that the blood stream velocity of a blood stream as a target is increased, the overlap rate is gradually increased in the same direction.

The setting of the overlap rate can be performed as follows, for example. When the imaging range (imaging site) is determined, the overlap rate is determined for each of the slice located at the most upstream side and the slice located at the most downstream side. A method of calculating the overlap rate is the same as the first embodiment. The overlap rates for the intermediate slices therebetween are determined according to the following expression (5).

$$Ri = R1 - (i-1) \times (R1-R2)/n \quad (5)$$

In the expression, Ri represents the overlap rate of an i-th slice from the slice at the most upstream side, R1 and R2 represent overlap rates of the slices at the most upstream side and the most downstream side, and n represents the number of slices in the imaging range.

In the expression (5), the following modifications may be made: (1) the overlap rate R1 of the slice at the most upstream side is set to 100, and the overlap rate Ri of the slice at the most downstream side is calculated, (2) the overlap rate R2 of the slice at the most downstream side is set to zero and the overlap rate Ri of the slice at the upstream side is calculated, and (3) the overlap rate R1 of the slice at the most upstream side is set to 100, and the overlap rate R2 of the slice at the most downstream side is zero. In the expression (5), the overlap rate is linearly varied between slices, however, it may be varied non-linearly in accordance with the blood stream. Furthermore, the imaging range may be divided into regions whose number is smaller than the number of slices, and the overlap rate may be stepwise varied in these regions. In this case, the overlap rate may be calculated every divisional region. The overlap rate of each slice may be displayed on the display 26.

In this embodiment, the overlap rate of the pre-saturation area is varied in accordance with the blood stream velocity every imaging site, whereby the blood vessel depicting performance can be enhanced. This embodiment is preferable to a case where a broad region in which the blood stream velocity greatly varies is imaged.

Third Embodiment

Next, as a third embodiment will be described a case where awaiting time Tw from the pre-saturation pulse till the actual measurement sequence is set in place of or in addition to the overlap rate.

Figure 7:
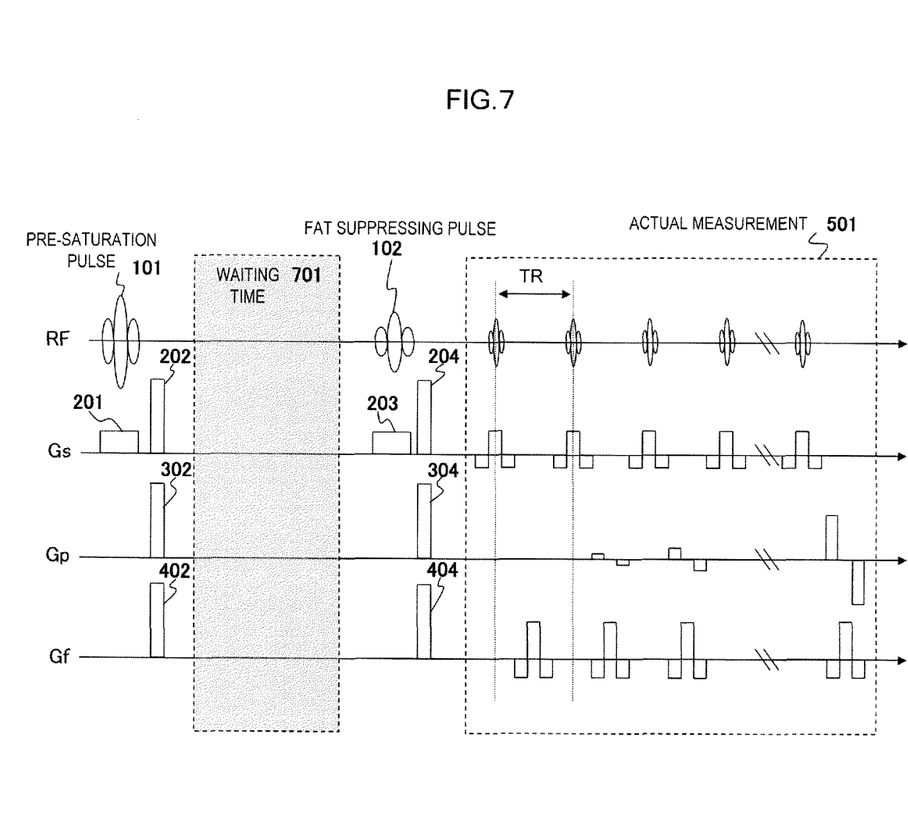
FIG. 7 is a diagram showing another example of the imaging sequence for depiction of blood vessels adopted in this invention.

FIG. 7 shows an example of the imaging sequence of this embodiment. In FIG. 7, the SSFP sequence is shown as the actual measurement sequence, however, the TOF method or the normal gradient type pulse sequence may be used. The imaging sequence comprises the pre-saturation pulse 101, the fat suppression pulse 102 and the actual measurement sequence 501 as in the case of the first embodiment. However, this embodiment is characterized in that any waiting time 701 is set from the pre-saturation pulse 101 till the pulse sequence 501 of the actual measurement.

Figure 8:
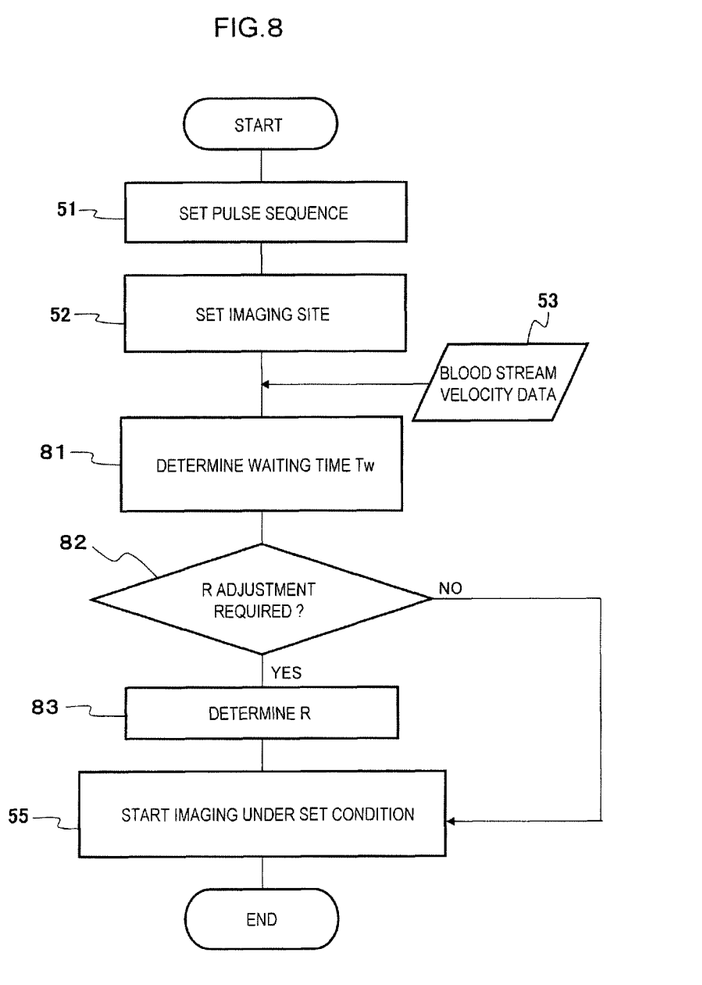
FIG. 8 is a diagram showing another embodiment of the procedure of the pre-saturation control.

Next, the procedure of setting the waiting time will be described with reference to the flowchart of FIG. 8. The same processing as the flowchart of FIG. 5 is represented by the same reference numerals, and the description thereof is omitted.

First, when the user sets the imaging sequence and the imaging site, the information on the blood stream velocity is read out from the table 53 representing the relationship between the imaging site and the blood stream velocity to calculate and set the waiting time Tw in accordance with the blood stream velocity (step 81). In this case, the information on the blood stream velocity is not read out from the table 53, but the user may be prompted to input an estimated blood stream velocity corresponding to an imaging site of the examinee. Alternatively, the blood stream velocity determined by the previous measurement may be automatically set.

The waiting time Tw is calculated as follows. The blood stream velocity of blood which should be subjected to signal suppression is represented by V. In the imaging sequence shown in FIG. 7, the initial setting of the interval from the pre-saturation pulse 101 till the pulse sequence 501 of the actual measurement is set to T0.

The time t (=d/V) in which the blood of the blood stream velocity V perfectly flows into the imaging slice of the thickness d from application of pre-saturation till start of the actual measurement sequence is desired to satisfy T0>t. However, when the blood stream velocity V is low, T0<t. Therefore, the waiting time Tw is determined so as to satisfy T0+Tw>t. The actual measurement sequence is required to be executed during a period for which the pre-saturation based on the pre-saturation pulse is effective, and thus the waiting time Tw has a limitation Tr of relaxation time as shown in the following expression.

$$Tr > Tw > t - T0$$

After the waiting time Tw is set in step 81, the overlap rate R of the pre-saturation area is set as occasion demands (steps 82, 83), and the imaging is performed with the set waiting time Tw and the overlap rate R.

In this embodiment, the imaging of all the slices may be performed while the set waiting time Tw is fixed, or the waiting time Tw may be set to vary every slice or stepwise.

Fourth Embodiment

Figure 9:
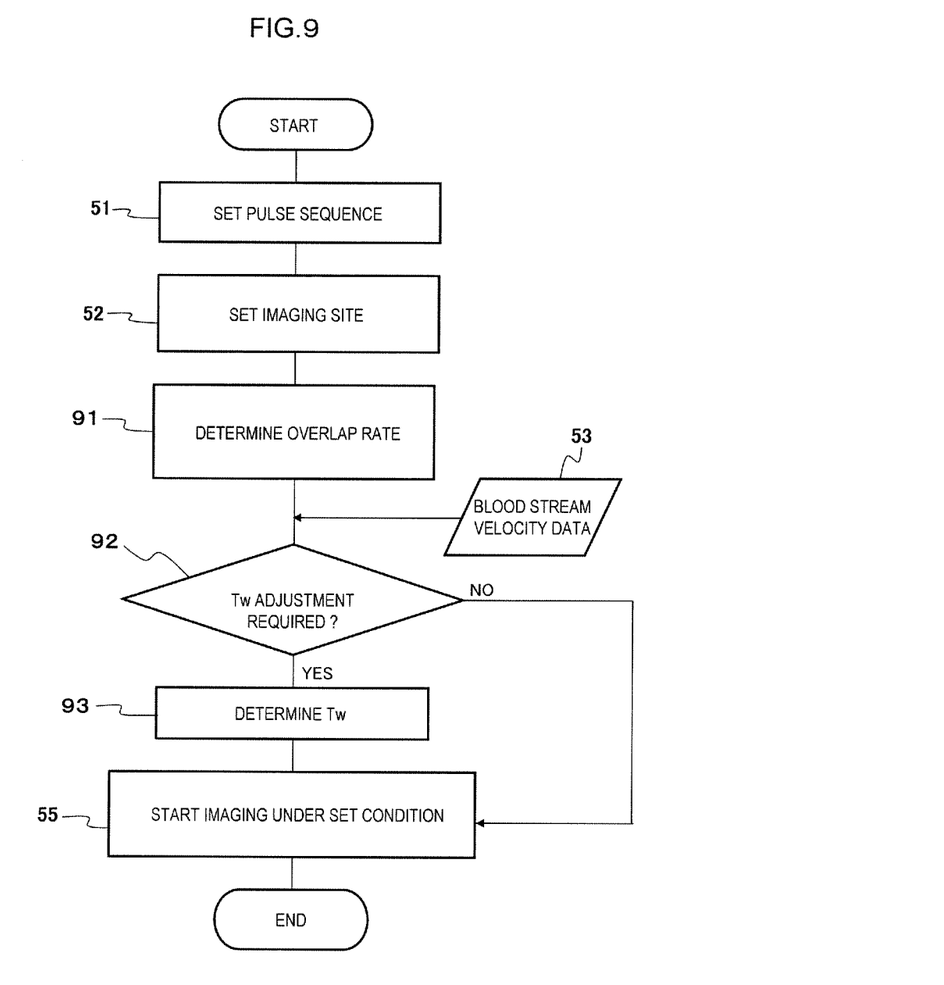
FIG. 9 is a diagram showing another embodiment of the procedure of the pre-saturation control.

In the third embodiment, the waiting time Tw is set preferentially to the overlap rate R. However, in this embodiment, the overlap rate R is first set, and then the waiting time Tw is set in accordance with the set overlap rate R and the blood stream velocity. FIG. 9 shows the procedure. In FIG. 9, the same processing as the flowcharts of FIGS. 5 and 8 is represented by the same reference numerals, and the description thereof is omitted.

When the imaging sequence and the imaging site are first set by the user, the information on the blood stream velocity is obtained from the table 53 or by user's input, and the overlap rate of the pre-saturation area is set (step 91). the overlap rate R may be determined so as to satisfy the expression (3) in accordance with the blood stream velocity, or a predetermined numerical value may be set.

$$T \geq (d \times (100 - R)/100)/Va \quad (3)$$

In the expression (3), T represents the interval from the pre-saturation pulse to the actual measurement sequence, d represents the slice thickness of the imaging cross-section, and Va represents the blood stream velocity of blood A to be subjected to signal suppression.

Subsequently, it is determined whether the determined overlap rate R satisfies the expression (4) or not (step 92). When the overlap rate satisfies the expression (4), the pre-saturation area is set at this overlap rate R, and the imaging is started (step 55).

$$T \geq (d \times R/100)/Vb \quad (4)$$

In the expression (4), Vb represents the blood stream velocity of the blood B to be imaged.

When the above expression is not satisfied, TW satisfying the following expression is calculated, and it is set as the waiting time (step 93):

$$T + Tw \geq (d \times R/100)/Vb.$$

In this case, the waiting time Tw is provided with a limitation Tr of the relaxation time. The imaging is started under the condition set in step 91 and step 93 (step 55).

In this embodiment, the overlap rate R to be set in step 91 may be kept to 100%, for example, and when the expression (4) is not satisfied at the overlap rate concerned, the waiting time may be set. In this case, if the blood stream velocity of blood to be imaged can be predicted, the blood stream depicting performance can be enhanced by only adjusting the waiting time Tw. In addition, when the overlap rate R is kept to 100%, the signal from the imaging area other than the blood B is suppressed by the pre-saturation pulse at the time point of the actual measurement, and thus the high blood stream depicting performance can be attained.

The embodiments of the present invention have been described above. The present invention is characterized in that (1) the pre-saturation area and/or the waiting time from the pre-saturation pulse till the actual measurement sequence is controlled in accordance with the blood stream velocity, or (2) the pre-saturation area is overlapped with the imaging area, and various modifications may be made within the scope of these features. For example, in the above embodiments, a blood stream flowing in one direction in an imaging area is depicted. However, with respect to a site whose blood stream direction is not fixed like a heart, a pre-saturation area is set so as to be overlapped with an imaging area, whereby a background signal can be suppressed, and only a blood stream which newly flows into a heart can be depicted.

Furthermore, the present invention is applicable to not only a case where the blood stream velocity is low, but also a case where the blood stream velocity is relatively high, the background signal can be suppressed, and the blood stream depicting performance can be enhanced. Still furthermore, the present invention is a technique of selectively imaging only blood flowing into an imaging cross-section, and the blood vessel depicting performance can be enhanced by using synchronous measurement in combination.

The invention claimed is:

1. A magnetic resonance imaging apparatus, comprising:
a measurement controller configured to control measurement of an echo signal from an imaging area containing blood streams, flowing different directions, of an examinee on the basis of (i) a pulse sequence containing a pre-saturation pulse for pre-saturating a pre-saturation area of an examinee and (ii) an actual imaging sequence for measuring an echo signal from the imaging area, wherein at least a part of the pre-saturation area is overlapped with the imaging area; and a calculation processor configured to re-construct a blood vessel image by using the echo signal, wherein the measurement controller controls a rate of overlapped area against the imaging area in accordance with the velocities of the pre-saturated blood streams so that one of the pre-saturated blood streams to be subjected to signal suppression in the blood vessel image fills a blood vessel thereof in the imaging area and the other of the pre-saturated blood streams to be imaged in the blood vessel image flows out from the imaging area at the time of the measurement of an echo signal by the actual imaging sequence.

2. The magnetic resonance imaging apparatus according to claim 1, wherein the blood stream contains plural blood streams different in flowing direction, and the measurement controller pre-saturates an area at a flow-out side of a blood stream to be imaged in the imaging area.

3. The magnetic resonance imaging apparatus according to claim 2, wherein the blood stream contains artery and vein, and the measurement controller pre-saturates an area at a flow-out side of the artery in the imaging area.

4. The magnetic resonance imaging apparatus according to claim 1, wherein the imaging area is sectioned into plural slices, the measurement controller executes the pulse sequence to perform imaging every slice, and the calculation processor combines blood vessel images of the respective slices to obtain a vessel image of the imaging area.

5. The magnetic resonance imaging apparatus according to claim 4, wherein the measurement controller sets an area to be pre-saturated in each slice by the pre-saturation pulse so that the areas of at least two slices are different from each other.

6. The magnetic resonance imaging apparatus according to claim 5, wherein the measurement controller controls the area to be pre-saturated in each slice in accordance with a blood stream velocity.

7. The magnetic resonance imaging apparatus according to claim 6, wherein the measurement controller sets the area to be pre-saturated so that a pre-saturated area in a slice through which a blood stream having a high blood stream velocity flows is broader than a pre-saturated area in a slice through which a blood stream having a low blood stream velocity flows.

8. The magnetic resonance imaging apparatus according to claim 4, wherein the measurement controller shifts a slice to be imaged in an opposite direction to a direction of a blood stream to be imaged.

9. The magnetic resonance imaging apparatus according to claim 1, wherein the measurement controller sets a time between the pre-saturation pulse and the actual imaging sequence in accordance with a velocity of the blood stream and a relaxation time of the pre-saturation.

10. The magnetic resonance imaging apparatus according to claim 9, wherein the measurement controller controls a pre-saturation area in the imaging area in accordance with the time between the pre-saturation pulse and the actual imaging sequence.

11. The magnetic resonance imaging apparatus according to claim 1, wherein the measurement controller sets a time between the pre-saturation pulse and the actual imaging sequence in accordance with a rate of a pre-saturation area in the imaging area and a velocity of the blood stream.

12. The magnetic resonance imaging apparatus according to claim 1, further comprising an overlap rate input unit configured to accept a setting input of an overlap rate that is defined as a rate of a pre-saturation area in the imaging area.

13. The magnetic resonance imaging apparatus according to claim 1, further comprising a blood stream velocity input unit configured to accept an input of a velocity of the blood stream.

14. A blood vessel imaging method, performed by a magnetic resonance imaging apparatus, for measuring an echo signal from an imaging area containing blood streams, flowing different directions, of an examinee on the basis of (i) a pulse sequence containing a pre-saturation pulse for pre-saturating a pre-saturation area of an examinee and (ii) an actual imaging sequence for measuring an echo signal from the imaging area, wherein at least a part of the pre-saturation area is overlapped with the imaging area, and re-constructing a blood vessel image by using the echo signal, said method comprising:

a step, performed by the magnetic resonance imaging apparatus, to set the pre-saturation area to be pre-saturated by the pre-saturation pulse in accordance with a velocity of the blood stream so that at least a part of the pre-saturation area is overlapped with the imaging area;

a pre-saturating step, performed by the magnetic resonance imaging apparatus, to pre-saturate the set pre-saturation area by the pre-saturation pulse;

a measuring step, performed by the magnetic resonance imaging apparatus, to measure an echo signal from the imaging area;

a controlling step, performed by the magnetic resonance imaging apparatus, to control a rate of overlapped area against the imaging area in accordance with the velocities of the pre-saturated blood streams so that one of the pre-saturated blood streams to be subjected to signal suppression in the blood vessel image fills a blood vessel thereof in the imaging area and the other of the pre-saturated blood streams to be imaged in the blood vessel image flows out from the imaging area at the time of the measurement of the echo signal by the actual imaging sequence; and a re-constructing step, performed by the magnetic resonance imaging apparatus, to re-construct the blood vessel image by using the echo signal.

15. The blood vessel imaging method according to claim 14, further comprising repeating the pre-saturating step and the measuring step, and to image, every slice, the imaging area that is sectioned into plural slices, wherein the re-constructing step combines blood vessel images which are re-constructed every slice, thereby obtaining a blood vessel image of the imaging area.

* * * * *